US008932766B1

(12) United States Patent
Hill

(10) Patent No.: US 8,932,766 B1
(45) Date of Patent: Jan. 13, 2015

(54) NANOSTRUCTURED THERMOELECTRIC ELEMENTS, OTHER ULTRA-HIGH ASPECT RATIO STRUCTURES AND HIERARCHICAL TEMPLATE METHODS FOR GROWTH THEREOF

(75) Inventor: Justin J. Hill, Merritt Island, FL (US)

(73) Assignee: Mainstream Engineering Corporation, Rockledge, FL (US)

( * ) Notice: Subject to any disclaimer, the term of this patent is extended or adjusted under 35 U.S.C. 154(b) by 276 days.

(21) Appl. No.: 13/346,760

(22) Filed: Jan. 10, 2012

(51) Int. Cl.
*H01M 4/80* (2006.01)
*C01B 33/10* (2006.01)
*C01B 33/02* (2006.01)
*B82Y 30/00* (2011.01)

(52) U.S. Cl.
CPC ............... *C01B 33/10* (2013.01); *Y02E 10/50* (2013.01); *Y02E 60/12* (2013.01); *C01B 33/02* (2013.01); *B82Y 30/00* (2013.01); *C01B 2202/08* (2013.01)
USPC ........ 429/236; 429/209; 429/218.1; 429/226; 429/231.95; 429/251

(58) Field of Classification Search
CPC ........ Y02E 60/12; Y02E 10/50; B82Y 10/00; B82Y 30/00; C11C 13/025; C01B 33/02; C01B 2202/08; C01B 33/10
USPC ......... 429/209, 218.1, 226, 231.95, 236, 251, 429/302; 977/720, 721, 722, 742, 778, 932, 977/948
See application file for complete search history.

(56) References Cited

U.S. PATENT DOCUMENTS

| 2010/0084014 A1* | 4/2010 | Roscheisen et al. .......... 136/256 |
| 2010/0093021 A1* | 4/2010 | Wirth et al. .................. 435/40.5 |
| 2010/0236596 A1* | 9/2010 | Lee et al. ...................... 136/230 |

OTHER PUBLICATIONS

Hicks and Dresslhaus; Thermoelectric figure of merit of a one-dimensional conductor, Phys. Rev. B, 1983. (47). 16631-16634.
Hochbaum, Chem, Delgado, Liang, Garnett, Najarian, Majumdar and Yang; Enhanced thermoelectric performance of rough silicon nanowires. Nature, 2008 (451), 163-167.
Jongmin and et al.; Tuning the crystallinity of Thermoelectric Bi 2 Te 3 nanowire arrays grown by pulsed electrodeposition. Nanotechnology, 2008, (19), 365701.
Joshi, Lee, Lan, Wang, Zhu, Wang, Gould, Cuff, Tang, Dresselhaus, Chen and Ren; Enhanced Thermoelectric Figure-of-Merit in Nanostructured p-type Silicon Germanium Bulk Alloys, Nano Lett., 2008, (8), 4670-4674.

(Continued)

*Primary Examiner* — Patrick Ryan
*Assistant Examiner* — Ben Lewis

(57) ABSTRACT

A method is disclosed for producing elements ultra-low diameter, ultra-high aspect ratio nanowires. A hierarchical template with ordered and arrayed nanopores either freestanding or on a support material is provided. The template can be pre-shaped. Optionally, one or more compounds can be layered within the nanopores to reduce the diameters thereof. The template is filled with material to form a nanostructure array configured as ultra-low diameter, ultra-high aspect ratio nanowires with a diameter of less than 10 nm. The optional layering is self-initiated by selectively adjusting pH of a coating material. The nanostructure array may be supported in a lower thermal conductivity material. The method can be used to produce elements that function as a phonon-confined thermoelectric device, a photovoltaic device and a battery.

22 Claims, 5 Drawing Sheets

(56) References Cited

OTHER PUBLICATIONS

Mannam, Agarwal, Roy, Singh, Varahramyan and Davis; Electrodeposition and Thermoelectric Characterization of Bismuth Talluride Nanowires. J. Electrochem. Soc., 2009. (156), B871-B875.
Pichanusakorn and Bandaru; Nanostructured thermoelectrics. Mat. Sci. Eng. R. 2009. (67), 19-63.
Yoo, Xiao, Bozhilov, Herman, Ryan and Myung; Electrodeposition of Thermoelectric Superlattice Nanowires, Adv. Mater., 2007, (19), 296-299.
Kim, Stroscio, Bhatt, Mickevicius and Mittin; Electron-Optical-Phonon Scattering Rates in a Rectangular Quantum Wire J. App.. Phys., 1991, (70), 319-325.
Hill, Cotton and Ziegler; Alignment and Morphology Control of Ordered Mesoporous Silicas in Andoic Aluminum Oxide Channels by Electrophoretic Deposition. Chem. Meter., 2009. (21), 1841-1846.
Liu, Wang, Indacochea and Wang: Intereference color of anodized aluminum oxide (AA0) films for sensor application, Sensors and Smart Structures Technologies for civil, Mechanical, and Aerospace Systems 2009, 2009, (7292), 72917-11.

\* cited by examiner

NANOSTRUCTURED THERMOELECTRIC ELEMENTS, OTHER ULTRA-HIGH ASPECT RATIO STRUCTURES AND HIERARCHICAL TEMPLATE METHODS FOR GROWTH THEREOF

BACKGROUND AND SUMMARY OF THE INVENTION

The present invention is directed to nanostructured thermoelectric elements and the like and a method for production thereof, namely by combining layer-by-layer assembly of silica or mesoporous silica precursors or other suitable compounds within ordered nanoporous templates to effectively reduce each individual nanopore diameter well below that of the limits of the as-fabricated nanoporous template. These hierarchical templates can be either fabricated freestanding or fabricated directly on support materials such as electrically conductive or insulating material. Furthermore, inclusion of material within the hierarchical nanopores facilitates the directed fabrication of ultra-high aspect ratio nanostructures. In the primary embodiment, these high aspect ratio nanostructures can be used for anisotropic, phonon-confined thermoelectric device fabrication. In addition, the fabrication process, as outlined, is a detailed method for the fabrication of conformal (or conformable) thermoelectric arrays which are grown on any shaped support; so long as the initial support is composed of aluminum, zinc, tin, antimony, titanium, magnesium, niobium, tantalum or any other metal that undergoes electrochemical formation of ordered nanopores. The materials listed are known producers of arrayed nanopores under anodic electrochemical oxidation (abbreviated hereto forth as "anodization" or anodized). In other embodiments these nanostructures can be leveraged in applications where ultra-high surface area, vertically oriented and arrayed nanostructures are desired. This secondary embodiment has applications in batteries, capacitors, electrochemistry, chemical conversion, photovoltaic devices and many other chemical and physical applications.

Improvements in thermoelectric (TE) energy conversion based on compositional research have nearly plateaued. However, the fabrication of existing thermoelectric materials with nanoscale dimensions has recently provided substantial advancements in device performance, as thermoelectric performance is well understood to improve substantially with increasing nanostructure anisotropy. [1: Hicks and Dresselhaus; Thermoelectric figure of merit of a one-dimensional conductor. Phys. Rev. B, 1993, (47), 16631-16634.]

Theoretical calculations show that one-dimensional nanowires are ideal thermoelectric devices, achieving figures of merit (zT) greater than 4 once the nanowire diameter falls below 5 nm. [1: Hicks and Dresselhaus; Thermoelectric figure of merit of a one-dimensional conductor. Phys. Rev. B, 1993, (47), 16631-16634.] Although synthesis of nanowires through the vapor-liquid-solid (VLS) method has achieved the dimensions required for enhanced thermoelectric performance, it is difficult to arrange these nanostructures into the architecture required for thermoelectric devices. Several researchers have applied the principles of the VLS method to fabricate vertically oriented arrays of nanowires through chemical vapor deposition (CVD). However, the surface tension between the seed catalyst and substrate determine the diameter of the nanowire. Ostwald ripening further places an upper limit on the diameters obtained. Typically, the diameters of nanowires prepared in the vertical arrays by CVD are much larger than the VLS method.

The caveats in preparing nanowire-based thermoelectric devices (thermoelectric nanowire) are (1) the ability to fabricate sub-10 nm diameter nanowires controllably and cheaply and (2) to systematically produce thermoelectric nanowires with a well-defined range of diameters on the 1-10 nm scale in order to better understand the practical ramifications of the theoretical predictions. The method of the present invention is able to employ nanoscale fabrication in the preparation of thermoelectric devices with a zT greater than 2. The present invention fabricates vertically oriented arrays of nanowires via ultra-high aspect ratio nanoporous templates with suitable properties for applications in TE devices. The nanowire arrays are fabricated with the aid of porous templates. These templates precisely direct nanowire diameter and aspect ratio through altering the conditions used to prepare the template. The advantage of this approach over CVD-based methods is the elimination of problems associated with seed catalyst. In addition, the use of templates provides a better range of nanowire diameter, length, orientation and array density, allowing for a systematic study of the effects of dimensionality on thermoelectric properties.

In a thermoelectric material, the redistribution of charge carriers is simultaneously associated with the formation of an electric field and a temperature gradient. Thus, the external application of a thermal gradient across the material results in the formation of an electrical bias. Likewise, an externally applied bias across the thermoelectric will cause heat to flow through the material. The degree that a particular material responds to either imposition is measured by the material's thermoelectric figure of merit, zT $$zT = \frac{\sigma \alpha^2 T_{av}}{\kappa_e + \kappa_{ph}} \quad (1)$$

Where $\sigma\alpha^2$, $\kappa_e$, $\kappa_{ph}$ and $T_{av}$ are the thermoelectric material's electrical conductivity, Seebeck coefficient, thermal conductivity due to electrons and phonons, and average temperature, respectively. Thermoelectric efficiency increases with both zT in Equation. (1) and the Carnot efficiency ($\eta_c = 1$, $T_{cold} = T_{hot}$), which is given by the ratio of temperatures from heat-source to heat-sink.

Equation. (1) highlights the primary route to enhanced thermoelectric performance: increasing $\sigma$ or decreasing $\kappa$ without affecting the other. Unfortunately, in bulk materials, $\kappa$ and $\sigma$ are directly coupled such that one cannot be altered without proportionally affecting the other in the same direction. This balance in conductivities has led to a bottleneck in thermoelectric materials research. Indeed, no thermoelectric material has been discovered with a zT>1 since the 1950's. In the last decade, many devices with zT>1 have been achieved through the introduction of nanostructures in bulk thermoelectric materials as well as in nanostructured thermoelectric materials themselves. [2: Hochbaum, Chen, Delgado, Liang, Garnett, Najarian, Majumdar and Yang; Enhanced thermoelectric performance of rough silicon nanowires. Nature, 2008, (451), 163-167, 3: Jongmin and et al.; Tuning the crystallinity of thermoelectric Bi2 Te3 nanowire arrays grown by pulsed electrodeposition. Nanotechnology, 2008, (19), 365701, 4: Joshi, Lee, Lan, Wang, Zhu, Wang, Gould, Cuff, Tang, Dresselhaus, Chen and Ren; Enhanced Thermoelectric Figure-of-Merit in Nanostructured p-type Silicon Germanium Bulk Alloys. Nano Lett., 2008, (8), 4670-4674, 5: Mannam, Agarwal, Roy, Singh, Varahramyan and Davis; Electrodeposition and Thermoelectric Characterization of Bismuth Telluride Nanowires. J. Electrochem. Soc., 2009, (156), B871-B875, 6: Pichanusakorn and Bandaru; Nanostructured thermoelectrics. Mat. Sci. Eng. R, 2009, (67), 19-63, 7: Yoo, Xiao, Bozhilov, Herman, Ryan and Myung; Electrodeposition of Thermoelectric Superlattice Nanowires. Adv. Mater., 2007, (19), 296-299.] New advancements through thermoelectric nanowire morphologies have shown that the anisotropy of the nanostructure diminishes transport of phonons through the thermoelectric but not charge carriers. Effectively decoupling κ from σ, this allows for the reduction of thermal conductivity without a significant change in electrical conductivity. This occurs in nanostructures due to the respective wavelengths of phonons and electrons; while the wavelength of the phonon is related to the crystal lattice parameter, the de Broglie or Compton wavelength of electrons is much smaller. Phononic energy wavelengths are on the order of 1-10 nm, roughly 1000-10,000 times larger than that of an electron. Often beginning at a few hundred nanometers of nanostntcture confinement, phonon waves begin to interact. As the nanostructure confinement increases below the phonon localization length (<100 nm), phonon waves experience an unallowable energy state and are localized at the surface. At 1-10 nm, the thermoelectric structure acts as a phonon wave-guide, severely disrupting heat propagation and severely diminishing thermal conductivity. Nanostructuring has also led to enhanced thermopower ($\textcircled{R}T_{av}$).

Many types of thermoelectric nanowires have been developed which include combinations of materials such as Bi, Be, Ge, Pb, Sb, Se, Si, Te and Zn. Phonon localization has been observed in Si thermoelectric nanowires by P. Yang and co-workers down to nanowire diameters of 22 nm highlights the differences in the intrinsic thermal conductivity of a Si when it becomes increasingly. anisotropic. [Hochbaum, Chen, Delgado, Liang, Garnett, Najarian, Majumdar and Yang; Enhanced thermoelectric performance of rough silicon nanowires. Nature, 2008, (451), 163-167.] As nanowire diameter decreases, phonon interaction causes wave superposition, folding and scattering, resulting in a lower thermal conductivity. Studies also report no effective reduction in electrical conductivity as thermal conductivity was decreased. Unfortunately, the decrease of conductivity due to phonon interaction only results in a moderate increase in zT, likely because sufficient nanowire anisotropy has not yet been reached.

Theoretical calculations show the immense potential that ultra-low diameter nanostructures can have on zT. [1: Hicks and Dresselhaus; Thermoelectric figure of merit of a one-dimensional conductor. Phys. Rev. B, 1993, (47), 16631-16634.] Such calculations show, however, that significant enhancements in zT are only observed once the confinement length (i.e. nanowire diameter) drops below 20 nm. Only at dimensions below 10 nm is the nanostructure confinement on the order of or less than that of the phonon wavelength. A 100-fold increase in phonon scattering has been found as nanowire diameter decreased from 20 to 1 nm, while electron scattering only decreased by a factor of 2. [8: Kim, Stroscio, Bhatt, Mickevicius and Mitin; Electron-Optical-Phonon Scattering Rates in a Rectangular Quantum Wire. J. Appl. Phys., 1991, (70), 319-325.] Therefore, achieving zT 4 likely requires nanostructures with diameters less than 5 nm.

The increases in zT described above have not been experimentally obtained due to the difficulty associated with fabrication of ultra-low diameter nanostructures. Furthermore, these dimensions are beyond the current technology of lithography and reactive ion etching. One of the most successful approaches for producing nanowires is based on the vapor-liquid-solid (VLS) growth process. The diameter of the nanowire is determined by the size of the seed nanocrystal with diameters approaching molecular dimensions (as small as 3 nm). One inherent problem with these approaches, however, is the formation of entangled meshes of nanowires. For this reason, vertical arrays using seed nanocrystals on substrates have been created through chemical vapor deposition (CVD), an approach that generates aligned, single-crystalline nanowires but whose diameters are typically much larger than the VLS method. These larger diameters are due to the combined effects of surface tension and Oswald ripening, but this makes small diameter nanowires very difficult to achieve.

Others have focused on forming nanowires in predefined architectures to allow easier processing and integration of the nanostructures into functioning devices. Fabrication of nanowires within an ordered template offers the possibility of manipulating nanowires into useful configurations and allows their aspect ratios and, hence, their physical properties to be tailored. Nanometer-wide channels of ordered anodic aluminum oxide films, polycarbonate track etched membranes, oriented steps at single crystal surfaces and nanochannel array glasses have previously been used as templates for nanowires. However, anodic aluminum oxide provides the highest degree of control over nanowire diameter, length spacing, density and orientation.

The formation of ordered nanoporous arrays via the controlled electrochemical anodic oxidation of aluminum has been studied since 1970 both as freestanding anodic aluminum oxide (AAO) templates on aluminum and as supported films on other materials. Recently, there have been attempts to fabricate AAO on transparent conductive oxides as a facile route in order to produce photovoltaic or ancillary photovoltaic devices via low-cost electrochemical methods. Usage of AAO directly or as an indirect route to nanostructure synthesis is an attractive method as aluminum is a low-cost material and the electrochemical self-assembly of the nanoporous array upon aluminum anodization is a low-cost method. As such, AAO has been utilized to fabricate, by electrodeposition, condensation or layer-by-layer coating, a wide variety of freestanding nanostructures or oriented arrays of nanostructures on supports. The pore diameter, spacing (density) and arrangement are strongly affected by anodization bath (acid) composition, concentration as well as temperature and applied anodization potential. The length of the nanopores are determined purely by anodization time and etch rate: which is slow for mild anodization (2-10 μm/h) and much more rapid for hard anodization (60-100 μm/h). Typically, the largest pores are obtain by mild anodization in phosphoric acid at high voltages (1-3 M, ~100 V), which yields pores on the order of 150-500 nm in diameter. Similarly, mild anodization in oxalic acid at moderate voltages and sulfuric acid at low voltages (0.3 M, 40-80 V and 10-30 V, respectively) yield pores with diameters in the range of 50-100 nm and 10-50 nm, respectively. Furthermore, hard anodization at high voltages in oxalic acid (0.3 M, 120-140 V) has recently been employed to fabricated low pore density AAO at higher growth rates. The methods developed and presented in the following application, however, can dramatically enhance pore density (porosity) during hard anodization in oxalic acid.

Aside from the conformal nature of the invention, the primary advancement is the ability to reduce the diameter of the AAO below its natural lower limit by incorporation of other materials within or on the walls of the AAO pores. This has been accomplished through filling the AAO pores with mesoporous silica, coating the AAO pores with mesoporous silica [9: Hill, Cotton and Ziegler; Alignment and Morphology Control of Ordered Mesoporous Silicas in Anodic Aluminum Oxide Channels by Electrophoretic Deposition. Chem. Mater., 2009, (21), 1841-1846.] or layer-by-layer deposition on the AAO template [10: Liu, Wang, Indacochea and Wang; Interference color of anodized aluminum oxide (AAO) films for sensor application. Sensors and Smart Structures Technologies for Civil, Mechanical, and Aerospace Systems 2009, 2009, (7292), 729217-11.]. Furthermore, the fabrication of thermoelectric nanostructures within ultra-low diameter nanopores has been predicted and partially verified to substantially enhance factors contributing to thermoelectric performance.

FIG. 1 depicts the overall invention methodology. Aluminum is first molded into a shape such that it is conformal with the part to which it will be mated. Alternatively, the mating part itself may be used in the first step as long as it is constructed of aluminum or another suitable material as mentioned above. The part is then placed in a cold acid bath and anodized to form the nanoporous template, with anodization time depending on the desired pore depth and the final template etched to open up the bottom of the pore as well as slightly widen the pores. The anodization voltage, bath temperature as well as acid composition and concentration are adjusted to control oxide growth rate, pore diameter and density. At this point, the thermoelectric (or other) material can be electrodeposited into the template, forming high aspect ratio nanowires. Alternatively, a material can be used to coat the nanopores with a pore reduction material to obtain wall-coated nanopores (previously referred to as PRM) in order to shrink the diameter down below the lower limit obtained with anodization. This coating process can be self-initiating by adjusting the pH of a coating solution above (or below) the isoelectric point of the nanoporous material, inducing a net negative change (or positive; depending on the isoelectric point) on the surface of the material. If the PRM is chosen such that it charges oppositely than the nanopore surface, Coulombic attraction will induce deposition of the PRM until charge is balanced at the liquid-solid. Furthermore, if two PRMs are chosen such that they have opposite charges in a given solution, while inducing the same surface charge on the nanoporous material, a layer-by layer coating can be formed. The thickness of this coating can be controlled to dimensions as small as the thickness of the electrochemical double layer of the nanoporous material/solution/PRM system and as high as the pore diameter itself. Thereby, the pore diameter can be effectively reduced below the fabrication limits of the AAO. In addition, the nanopores can also be filled, subsequent to the PRM coating, with material which has a reduced diameter due to the PRM to create a Type I hierarchical structure.

An additional alternative to a coating process is to use electric fields to both (a) deposit a PRM within the AAO nanopores and (b) to form and axially aligned pores intrinsic to mesoporous PRMs within the AAO nanopores to create a Type II hierarchical structure as shown and described in more detail below. These pores can also be included with material to obtain a Type II hierarchical nanostructure array as will also be described.

Once the nanoporous template is filled with a thermoelectric material, a complete thermoelectric device is formed by closing the electrical circuit with a conductive contact junctioning a plurality of nanowires to a plurality of nanowires of a different dopant type (i.e. n- or p-type). Otherwise, the thermoelectric properties of the individual n- or p-type nanowire/AAO assembly can be gathered via electrical and thermal characterization. The method of the present invention provides a fabrication procedure to both: (i) investigate the dependence of thermoelectric properties (such as figure of merit, thermal and electrical conductivity) as a function of nanostructure anisotropy (nanowire diameter) and (ii) fabricate conformal nanostructured thermoelectric generators with efficiency improvements when compared to the performance of bulk material thermoelectric counterparts.

The AAO can be selectively dissolved, leaving behind and array of ultra-high aspect ratio PRM-coated or bare nanostructures. This array, while fragile, has better performance in a thermoelectric device due to the fact that all thermal energy is transported through the thermoelectric nanostructure material. Though the AAO has a low thermal conductivity, as low as 0.1 W/mK, and the bare PRM-coated nanostructure array is more desirable, it is also possible to support the PRM-coated nanostructure array in another material with a lower thermal conductivity material by simple dip coating methods. This material acts to structurally support the PRM-coated nanostructure array as well as minimize the amount of heat transported through the array, which is an energy loss mechanism.

The AAO templates produced in accordance with the present invention can be fabricated with a wide range of pore diameters, lengths and densities. Examples of several different sized pores fabricated by the inventor are shown herein. The hereinafter-described AAO templates were all obtained from mild anodization at a pore growth rate of 2-10 µm/h. AAO templates can, however, also be fabricated, with less versatility in pore diameter, using hard anodization. Several different pore diameters (x, y, z nm) can obtained via the hard anodization of aluminum in both oxalic acid at 120-140 V and sulfuric acid at 20-40 V, where each hard anodization is first preceded by mild anodization to create an insulating layer to prevent dielectric breakdown. The pore growth rate of the AAO is much higher, typically 50-300 µm/h. SEM imaging need not be employed to verify the formation of ordered and arrayed nanopores during the fabrication of AAO.

Monitoring of the chronoamperometric response has been successfully employed and is known. The AAO template serves as the preliminary structure directing medium for nanostructure growth. Whether using AAO templates or hierarchical templates containing a PRM, material can be electrodeposited within them to obtain ultra-high aspect ratio nanostructures. As an example FIG. 7 shows the electrical conductivity vs. temperature for as-electrodeposited $Bi_2Te_3$ thermoelectric films.

DETAILED DESCRIPTION OF THE DRAWINGS

Figure 1:
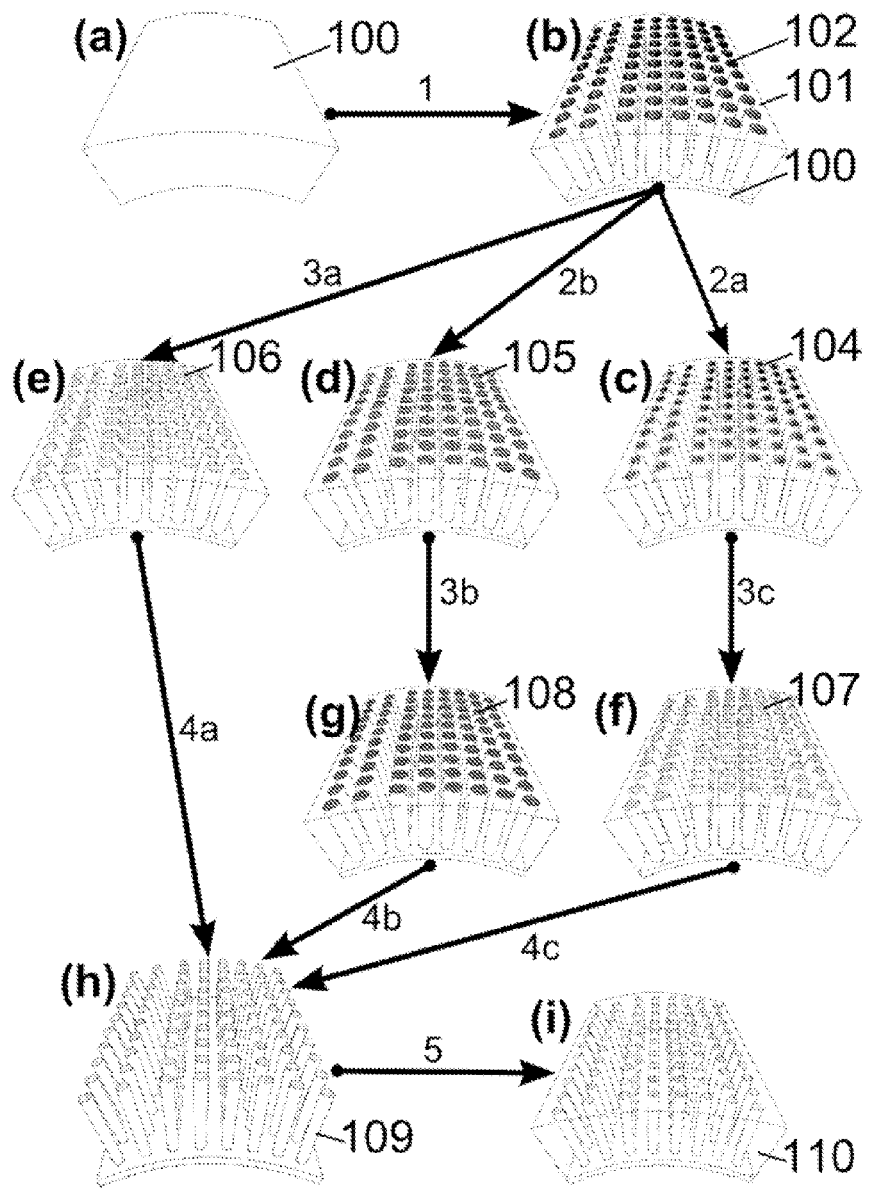
FIG. 1a is a perspective view of a piece of aluminum or any of the other above-mentioned sitable materials that has been shaped to be conformal with a heat generating surface prior to the first step employed in the general inventive method of the present invention.
FIG. 1b shows the aluminum piece shown in FIG. 1a but now with a supported or freestanding ordered nanoporous aluminum oxide (AAO) template obtained from electrochemical anodization to form high density and ordered nanopores.
FIG. 1c shows the AAO template of FIG. 1b with reduced nanopore diameters due to inclusion of a PRM to form a wall-coated nanopore array by electrostatic enhanced dip-coating with a material such as mesoporous silica or other compound.
FIG. 1d shows the AAO template of FIG. 1b with reduced nanopore diameters due to inclusion of a PRM to form a hierarchical nanopore by electrodeposition of a mesoporous material such as mesoporous silica.
FIG. 1e shows the AAO template of FIG. 1b that has been filled with a material to facilitate nanostructure growth within the nanopore with a diameter in the range of 10-500 nm and length in the range of 0.01-10,000 µm.
FIG. 1f shows the wall-coated AAO/PRM template of FIG. 1c that has been filled with a material to facilitate ultra-high aspect ratio nanostructure growth.
FIG. 1g shows the hierarchical AAO/PRM template of FIG. 1d that has been filled with a material to facilitate ultra-high aspect ratio nanostructure growth.
FIG. 1h shows a freestanding nanostructure array on the aluminum remaining from selective aluminum oxide etching of the templates obtained in FIGS. 1e, 1f or 1g.
FIG. 1i shows a nanostructure array obtained from selective etching of the templates of FIG. 1e, 1f, or 1g that has been re-supported with an ultra-low thermal conductivity material such as an aerogel by a coating method such as Langmuir-Blodgett or dip-coating.

FIG. 1a shows a shaped piece of aluminum 100. The aluminum can be moderate to high purity. Shaping the aluminum prior to anodization allows for the non-conformable AAO template to adopt the shape of the mating part and can be performed by mechanical methods, extrusion or any other method that alters the shape of the as-obtained aluminum. This enables ideal thermal contact with the mating part, thereby reducing heat loss and maximizing power output if the template is to be used to manufacture ultra-high aspect ratio, ultra-low diameter nanostructured thermoelectric devices. In Step 1 (as indicated by the arrow between FIGS. 1a and 1b), the piece is placed in a cold acid bath and anodized to form the nanoporous template shown in FIG. 1b, with anodization time depending on the desired pore depth and the final template etched to open up the bottom of the pore as well as slightly widen the pores.

FIG. 1b now shows the conformal aluminum work-piece 100 after anodization, creating aluminum supported AAO nanoporous template composed of an aluminum oxide matrix 101 containing a plurality of nanopores 102 that can be used as a structure-directing medium for nanostructure fabrication. The aluminum support 100 acts as an electrode to the nanostructure bottoms when fabricated within the template 101. Alternatively, the aluminum can be removed to create a conformal AAO template. The spacing and pore diameter of the nanopores 102 found within the AAO template 101 are uniform and can be controlled by altering the voltage or acid concentration/composition of the anodization process. Lower applied voltage for a given acid electrolyte generally reduces the pore diameter and spacing (increase pore density). The lower limit of AAO pore diameter is approximately 10 nm which achieves one of the primary objects of the present invention, namely AAO pore wall coating or inclusion of mesoporous material within the AAO pores to further reduce the diameter of the, now hierarchically structured, template.

In Step 2a, a material can be used to coat the nanopores with a pore reduction material to obtain wall-coated nanopores 104 (denoted heretofore as PRM) in order to shrink the diameter down below the lower limit obtained with anodization. FIG. 1c shows a template composed of an AAO 100 plus matrx 101 and a plurality of nanopores 102 whose walls have now been coated with a PRM 104 such as, but not limited to, mesoporous silica or other colloidal compounds. This method creates a Type 1 hierarchical template for nanostructure growth. The PRM coating 104 can be performed by placing the AAO template into a solution containing the PRM with a pH that induces oppositely charged surfaces on the PRM and aluminum oxide, respectively. This is done by careful selection of the PRM such that the PRM's isoelectric point at the pH of the given solution induces a surface charge opposite the AAO due to the isoelectric point of the aluminum oxide. This method of electrostatic enhanced dip-coating deposition is, of course, not the only way to pore wall-coat 104 as any other known method that effectively obtains pore wall-coated AAO templates is acceptable. Using such compounds as mesoporous silica also has the added advantage of creating rough pore walls which has been shown to enhance thermoelectric performance of nanostructures. [2: Hochbaum, Chen, Delgado, Liang, Garnett, Najarian, Majumdar and Yang; Enhanced thermoelectric performance of rough silicon nanowires. Nature, 2008, (451), 163-167.]

Alternatively, with reference to Step 2b electric fields can be used to both (a) deposit a PRM within the AAO nanopores and (b) to form and axially align pores intrinsic to mesoporous PRMs 105 within the AAO nanopores to create a Type II hierarchical structure. The result is shown in the AAO template in FIG. 1d where a mesoporous material has been electrodeposited within each aluminum oxide nanopore 102 to create mesopores 105 composing a Type II hierarchical template for nanostructure growth. The applied electric fields have been shown in the present invention not only to fully incorporate the PRM into the AAO pore but also to axially align the mesopores 105 of the PRM with each AAO pore. [9: Hill, Cotton and Ziegler; Alignment and Morphology Control of Ordered Mesoporous Silicas in Anodic Aluminum Oxide Channels by Electrophoretic Deposition. Chem. Mater., 2009, (21), 1841-1846.] Inclusion of a thermoelectric material within this type II hierarchical template aids the thermoelectric device by increasing pore, and thus nanostructure, density.

In Step 3a, thermoelectric or suitable material can be electrodeposited into the template, forming high aspect ratio nanowires with the result shown in FIG. 1e where the nanopores 102 without a PRM have been filled with a material to produce nanostructures 106. This material can also be included within the AAO by other known methods. When the AAO template 101 is fabricated such that it is in electrical contact with the aluminum 100 from which it was made, the subsequently produced nanostructures 106 are in excellent electrical and thermal contact with the aluminum 100.

FIG. 1f shows the Type I hierarchical template 100 in which in Step 3c a nanostructure material 107 is included, resulting in reduced diameter nanopores 104. The coated nanopores 104 can be roughened to enhance thermoelectric material performance. Furthermore, the coated nanopores 104 have a reduced pore diameter. If the pore diameter, and thus nanostructure, is reduced below 20 nm and the nanostructure includes a thermoelectric material, significant thermoelectric performance enhancements should occur. Moreover, this method can be used to investigate the separation of thermal and electrical conductivity at the nanoscale as well as to evaluate nanoscale effects on thermopower. This device, along with theoretical modeling, can be used as an apparatus to evaluate phonon particle characteristics due to the controllability of the nanostructure diameter.

Alternatively to Step 3a, the nanopores 102 can be filled in Step 3b with material with a reduced diameter due to the PRM so as to create the Type II hierarchical structure shown in FIG. 1g having a plurality of mesopores 108 with a nanostructure material therein. All the same attributes highlighted in the description of FIG. 1f template structure are also found here with the additional benefits of higher nanowire density.

The resulting AAO 101 in FIGS. 1c-e can be selectively dissolved in Steps 4a-c, respectively, leaving behind and array of ultra-high aspect ratio PRM-coated or bare nanostructures 109 shown in FIG. 1h where now freestanding nanostructures 106, 107 or 108 on the formed aluminum 100 are obtained. These freestanding arrays can be obtained from the filled AAO, Type I or Type II templates. This system is more fragile than the systems that are shown in FIG. 1e, FIG. 1f or FIG. 1g, but has better thermoelectric performance if the pore filling material is thermoelectric in nature. This performance enhancement is due to the lower thermal conductivity of the air (or vacuum) that now separates the nanostructures 106, 107 or 108, forcing the majority of thermal energy to flow through the nanostructures and thus maximizing power generation.

As seen in Step 5, it is possible to support the PRM-coated nanostructure array in another material with a lower thermal conductivity material 110 by simple dip coating methods. The material 110 acts to structurally support the PRM-coated nanostructure array as well as minimize the amount of heat transported through item 110 which is an energy loss mechanism. The resulting array shown in FIG. 1i is one of the free standing nanostructure array items 106, 107 or 108 shown in FIG. 1h and produced by Steps 4a, 4b or 4c that has been re-supported with an ultra-low thermal conductivity material to facilitate most of the thermal energy transport occurrence within the individual nanostructures 110. This material can be fabricated by coating methods or other methods and the material 110 can be an aerogel or other generally known low thermal conductivity material.

Figure 2:
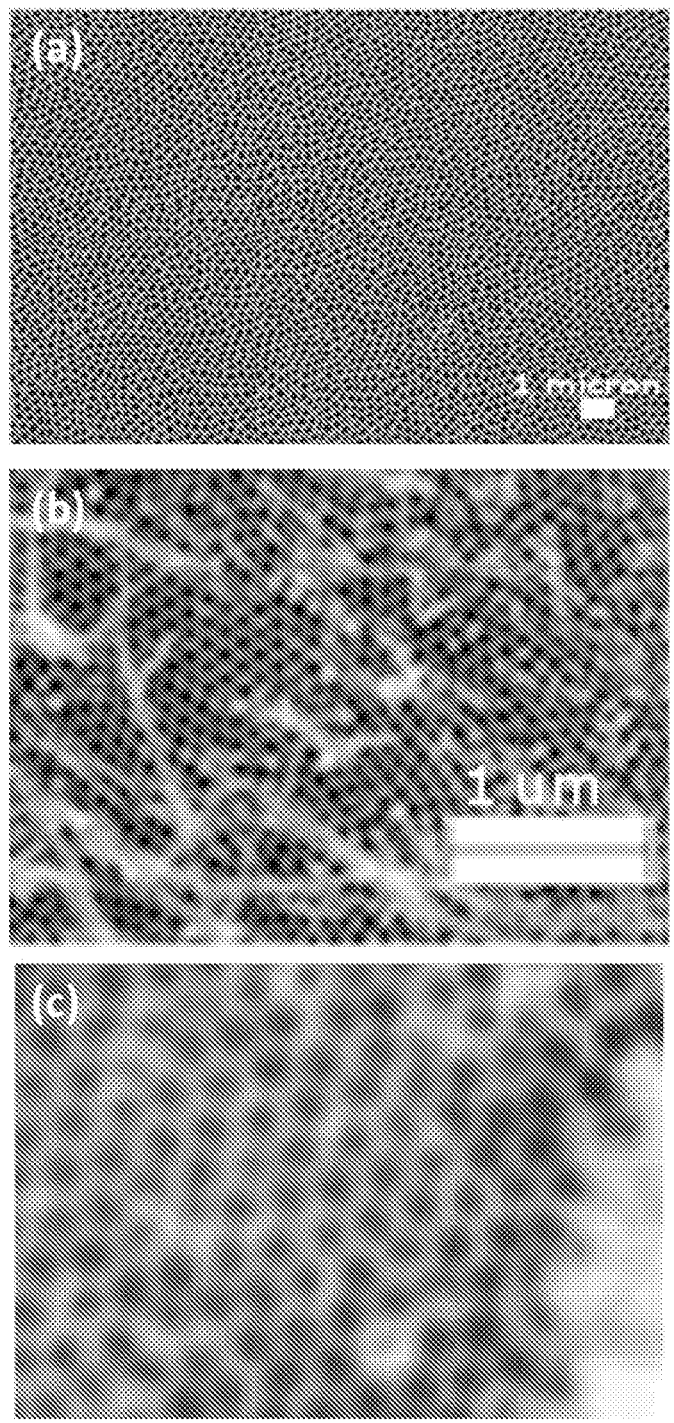
FIGS. 2a-c are SEM images of AAO fabricated with different pore sizes.

FIGS. 2a-c are SEM images of AAO produced in accordance with the present invention with different pore sizes. As shown, the pores are 150, 50 and 10 nm, respectively. These AAO templates were fabricated on transparent and conductive tin-doped indium oxide, on glass and as such could be incorporated into a solar cell device or other structure that requires optical transparency. FIG. 2a is the SEM image of 10-20 nm pores fabricated by anodization of aluminum in 5° C., 0.2 M, sulfuric acid at 25 V. The target of the film was the fabrication of low-aspect ratio, low-diameter nanostructures. However, much thicker (200 μm) thick AAO films with target diameters of 10-20 nm have also been fabricated. FIG. 2b is an SEM image of pores obtained from aluminum anodization in 10° C., 0.3 M oxalic acid at 60V, yielding 45 nm pores, and FIG. 2c is an SEM image of 145 nm AAO pores obtain from anodization in 1.3 M phosphoric acid, at 7° C. at 130 V.

Figure 3:
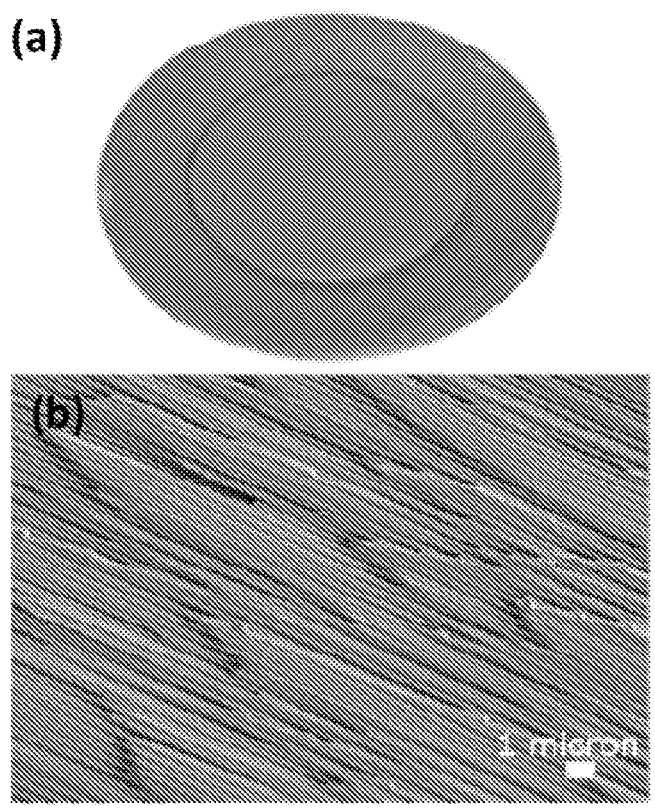
FIG. 3a is an optical photograph of the thermoelectric nanowire film and FIG. 3b is an SEM image showing ultra-high aspect ratio nanopores with a length of 1.6 mm.

FIG. 3 is an SEM image of ultra-high aspect ratio AAO obtained from hard anodization of aluminum. It shows 1,600 μM (1.6 mm) long AAO nanopores with an mean diameter of 125 nm (aspect ratio of 12,800) and a pore density of approximately $1.1 \times 10^9$ $cm^{-2}$. The aspect ratio of the nanopores obtained here is 12,800 and they are continuous throughout the entire 1.6 mm thickness. The pore growth rate observed in this study was approximately 50 μm/h and complete oxidation of the aluminum substrate was the only factor limiting continued pore growth. As such, aspect ratios much higher can reasonably be expected with thicker aluminum supports and longer anodization times. This is the highest reported aluminum oxide pore aspect ratio obtained from any method of aluminum-based nanopore fabrication method.

Figure 4:
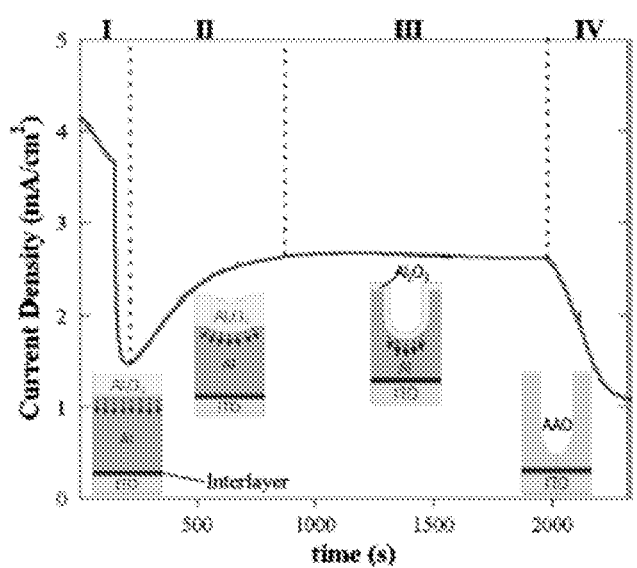
FIG. 4 is a chronoamperometric response plot of aluminum anodization that enables non-electron microscope verification of successful AAO pore formation.

FIG. 4 is a typical chronoamperometric response graph of mild aluminum anodization and shows the propagation of current as the anodization progresses at constant applied voltage. This is an in-situ method to verify successful nanopore fabrication as the change in current with time is indicative of the nanoscale mechanical and electrochemical processes that occur during anodization. Region I represents insulating planar oxide formation which causes an increased resistance to charge transfer, corresponding to a drop in passed current. It is a voltage ramp and planar oxide growth regime in which the resistance to charge transfer results from a thickening aluminum oxide layer. As such, current diminishes significantly during this time period. In order to maintain charge transfer, due to the extremely high interfacial electric field, the surface of the aluminum/alumina/electrolyte interface reconstructs to maintain a constant alumina layer thickness. It does this by surface dimpling (pore initiation), which ultimately leads to semispherical nanoscale dimples on the surface of the aluminum/alumina. This surface reconstruction causes a dramatic increase in surface area up to the point that the surface dimples become semispherical. Current is proportionally affected by electrode area and so Region II is the pore initiation region marked by a continuous increase in current, resulting in an increase in active surface area and a subsequent rise in passed current due to the increase electrode area (current density is scaled to the planar electrode area in FIG. 4). Once current plateau's and continues at constant voltage and current, electrode surface area is no longer increasing and Region III marks the pore growth period where the nanopores are fully formed. If there is a finite thickness to the aluminum support, current will fall off as the material is depleted, marking Region IV. Finally, as the aluminum is completely depleted the current falls due to a diminishing amount of reactant and increased electrical resistance of the thin aluminum film in Region IV.

Figure 5:
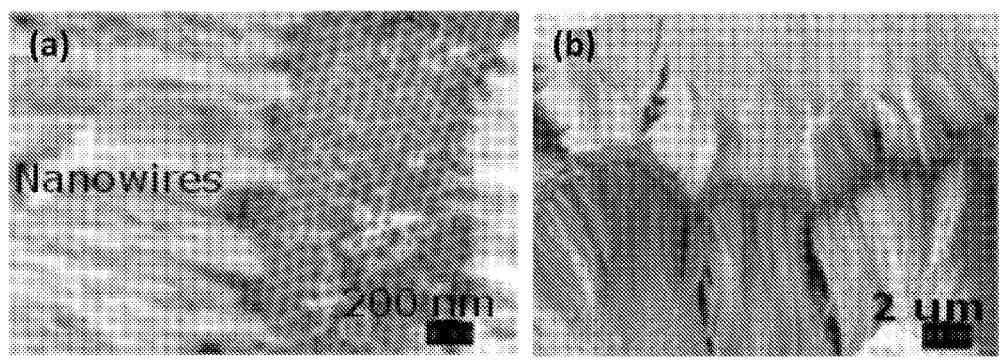
FIGS. 5a and b are SEM images of a $Bi_2Te_3$ thermoelectric nanowire array obtain from the method shown in FIGS. 1a-1h.

Simple as well as complex materials can be used to fill the pores of the AAO, Type 1 or Type II hierarchical templates and the template can be selectively removed. FIGS. 5a and 5b show a transmission electron microscope image of a mesoporous silica shell that once coated an AAO pore prior to selective AAO dissolution. The wall thickness of this shell is approximately 10 nm, reducing the pore diameter by approximately 10%. Using templates composed of 25 nm AAO pores and this particular mesoporous precursor solution (3 wt % Pluronic P123, in 50/50 ethanol/water) yields hierarchical templates with a mean pore diameter of 5 nm. As shown in FIGS. 5a and 5b, $Bi_2Te_3$ nanowires where fabricated and the template was selectively and partially removed in order to view their entirety under SEM image along with the AAO. The image on the left (FIG. 5a) is of 25 nanometer nanowires and the right image (FIG. 5b) is of 10 nm nanowires.

Figure 6:
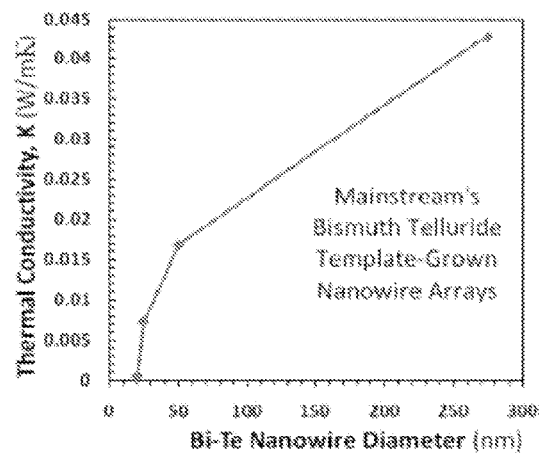
FIG. 6 is a graph of thermal conductivity versus diameter for $Bi_2Te_3$ nanowires fabricated from the method shown in FIGS. 1a-1e.

FIG. 6 is an SEM image of $Bi_2Te_3$ nanowire arrays obtained with the method of our invention via electrodeposition of the material into the template pores and shows the thermal conductivity of an $AAO/B_{i2}T_{e3}$ film as a function of nanowire diameter. As expected, the thermal conductivity decreases with diameter due to phonon confinement and transport restriction. However, enhancement to thermoelectric performance requires that thermal conductivity decreases while electrical conductivity remains constant or decreases. Other thermoelectric materials have also been test deposited as thin films within the contemplation of the present invention.

$Bi_2Te_3$ nanowire arrays with individual diameters of 1, 5, 10, 25, 50 and 300 nanometers were fabricated using the method of FIGS. 1a, b and e and FIGS. 1a, c and f (Steps 1 and 3a and Steps 1, 2a and 3c, respectively) and their thermoelectric performance was evaluated. Thermal conductivity was observed to decrease with decreasing nanowire diameter and electrical conductivity increased.

Figures 7A, 7B:
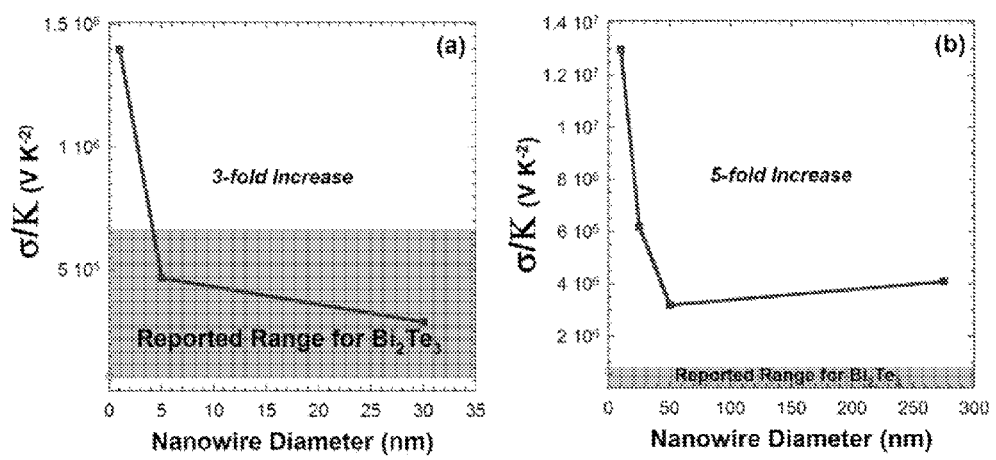
FIG. 7a is a graph showing the substantial increase in effective figure of merit as nanowire diameter is decreased to 10 nanometer using only AAO templates in accordance with the present invention.
FIG. 7b is a graph showing the substantial increase in effective figure of merit as nanowire diameter is decreased to approximately 1 nanometer by use of a PRM.

The effective figure of merit, defined here as the figure of merit scaled by temperature and the square of the Seebeck coefficient, is plotted for different nanowire diameters in FIGS. 7a and 7b. The data in FIG. 7a was produced from nanowires fabricated in lone AAO, while the data in FIG. 7b was produced from nanowires fabricated in PRM wall-coated templates. It is clearly shown in this figure that a 3- to 4.7-fold increase in effective figure of merit can be obtain with each respective fabrication method. This ultimately corresponds to a 1.5- to 2.4-fold increase in thermoelectric power conversion efficiency.

FIG. 7a shows the effective figure of merit (the ratio of electrical to thermal conductivity) as a function of nanowire diameter. Given thermal conductivity is decreased; the observed increase in effective figure of merit here is due to a departure from the Wiedemann-Franz correlation and will result in increased thermoelectric efficiency. The increase here is 3-fold when nanowire diameter is decreased to 10 nanometers.

FIG. 7b shows the effective figure of merit for a Type II templated nanowire array with nanowire diameters from 30 to 1 nanometer. Here the increase in effective figure of merit is almost 5-fold. This would correspond to a 2.4-fold increase in thermoelectric efficiency. Thus, FIGS. 7a and 7b demonstrate that nanostructured thermoelectric devices built in accordance with my invention will have substantially and surprisingly increased figures of merit in relation to non-nanostructured thermoelectric devices using the very same compositions.

While I have shown and described several embodiments in accordance with my invention, it should be clearly understood that the same is susceptible to numerous changes and modifications as will now be apparent to one skilled in this art but without departing from my inventive concept. Therefore, we do not intend to be limited to the details shown and described herein but intend to cover all such changes and modifications as are encompassed by the scope of the appended claims.

I claim:

1. A method for producing thermoelectric elements having ultra-low diameter, ultra-high aspect ratio nanowires, comprising: providing a hierarchical template with ordered and arrayed nanopores either freestanding or on a support material, layering at least one electrically-insulating colloidal silica compound within the nanopores, the compound being selected so as to employ coulombic attraction to reduce the diameter thereof by inducing phonon confinement for limiting thermal conductivity, and filling the template with thermoelectric material to form a nanostructure array comprised of the ultra-low diameter, ultra-high aspect ratio nanowires with a diameter of less than 10 nm.

2. The method of claim 1, wherein the support material is one of electrically conductive and insulating.

3. The method of claim 1, wherein the support material is selected from a material capable of producing the ordered and arrayed nanopores by electrochemical oxidation.

4. The method of claim 3, wherein the support material is selected from one of aluminum, zinc, tin, antimony, titanium, magnesium niobium and tantalum.

5. The method of claim 1, wherein the fabricating of the template includes anodization in a cold acid bath.

6. The method of claim 5, wherein voltage, bath temperature, and acid composition and concentration are selectively adjusted during anodization to control oxide growth rate, pore diameter and density of the nanopores.

7. The method of claim 5, wherein anodization time is selected to control depth of the nanopores.

8. The method of claim 1, wherein the layering is self-initiated by selectively adjusting pH of coating material.

9. The method of claim 1, wherein the layering is effected by two compounds having opposite charges in a solution and inducing a surface charge on the template.

10. The method of claim 1, wherein the layering and filling are effected by electric fields.

11. The method of claim 1, further comprising selectively dissolving the template after the ordered and arrayed nanowires have been formed.

12. The method of claim 1, further comprising supporting the nanostructure array in a lower thermal conductivity material.

13. The method of claim 1, wherein the nanostructure array is a $Bi_2Te_3$ nanowire array or other thermoelectric material.

14. The method of claim 1, further comprising pre-shaping the template.

15. The method of claim 1, further comprising etching the template so as to selectively widen and open the nanopores at a bottom thereof.

16. The method of claim 15, further comprising one of using aluminum as the template to function as an electrode to the bottom of the nanopores and removing the aluminum after filling the nanopores to create a conformal template.

17. A method of using the element of claim 1, comprising configuring the nanostructure array as an enhanced thermoelectric device.

18. The method according to claim 17, wherein the device has a composition with a figure of merit greater than a on-nanostructured thermoelectric materials having the same composition.

19. The method according to claim 17, wherein a figure of merit of the device increases with decreasing nanowire diameter.

20. An element produced by the process according to claim 1, wherein the element is configured to function as an enhanced thermoelectric device.

21. The element of claim 20, wherein the element is the thermoelectric device has a composition with a figure of merit greater than a non-nanostructured thermoelectric materials having the same composition.

22. The element according to claim 20, wherein a figure of merit of the device increases with decreasing nanowire diameter.

* * * * *